(12) United States Patent
Kobayashi

(10) Patent No.: US 8,135,370 B2
(45) Date of Patent: Mar. 13, 2012

(54) FM TUNER HAVING ADAPTIVE BANDPASS FILTER FOR ADJACENT CHANNEL INTERFERENCE

(75) Inventor: Keiji Kobayashi, Kawanishi (JP)

(73) Assignees: Sanyo Electric Co., Ltd., Osaka (JP); Sanyo Semiconductor Co., Ltd., Gunma (JP)

( * ) Notice: Subject to any disclaimer, the term of this patent is extended or adjusted under 35 U.S.C. 154(b) by 708 days.

(21) Appl. No.: 12/230,601

(22) Filed: Sep. 2, 2008

(65) Prior Publication Data

US 2009/0061801 A1    Mar. 5, 2009

(30) Foreign Application Priority Data

Sep. 4, 2007  (JP) ................................. 2007-228415

(51) Int. Cl.
*H04B 7/00* (2006.01)

(52) U.S. Cl. ........ 455/266; 455/307; 455/296; 455/224; 455/278.1; 455/254

(58) Field of Classification Search ............... 455/278.1, 455/63.1, 114.2, 296, 224, 266, 254
See application file for complete search history.

(56) References Cited

U.S. PATENT DOCUMENTS

| | | | |
|---|---|---|---|
| 4,947,456 A | | 8/1990 | Atkinson et al. |
| 4,977,615 A | * | 12/1990 | Suzuki et al. ............... 455/277.2 |
| 5,125,105 A | * | 6/1992 | Kennedy et al. ............ 455/164.1 |
| 5,287,558 A | * | 2/1994 | Hansen ........................ 455/296 |
| 5,493,717 A | * | 2/1996 | Schwarz ....................... 455/306 |
| 6,178,314 B1 | * | 1/2001 | Whikehart et al. ......... 455/188.1 |
| 6,389,273 B1 | * | 5/2002 | Brandenburg ................ 455/296 |
| 2005/0101273 A1 | | 5/2005 | Suto |
| 2005/0164665 A1 | * | 7/2005 | Suganuma ................. 455/278.1 |

FOREIGN PATENT DOCUMENTS

| | | |
|---|---|---|
| DE | 42 41 455 C1 | 3/1994 |
| EP | 0 430 469 A2 | 6/1991 |
| JP | A-08-102645 | 4/1996 |
| JP | A-09-046184 | 2/1997 |
| JP | A-09-294081 | 11/1997 |

OTHER PUBLICATIONS

European Search Report issued in European Patent Application No. 08 01 5656 on Oct. 8, 2009.

* cited by examiner

*Primary Examiner* — Edward Urban
*Assistant Examiner* — Stacey Sorawat
(74) *Attorney, Agent, or Firm* — Oliff & Berridge, PLC

(57) ABSTRACT

Adjacent interference is reliably detected in an FM tuner. A receiving field strength judgment circuit (102) compares a reception field strength signal $S_{M-DC}$ input from an S-meter circuit (92) and a reference voltage $V_{ref2}$, and outputs a receiving strength judgment signal $S_{RE}$. An SD band judgment circuit (104) uses a window comparator to determine, based on an f-V conversion characteristic of a detection output $S_{DET}$, whether or not a voltage $\Delta V$ generated based on $S_{DET}$ is within a voltage range corresponding to a narrow band $W_N$, and whether or not the voltage $\Delta V$ is within a voltage range corresponding to a wide band $W_W$; and outputs determination signals $S_{BD-N}$, $S_{BD-W}$ corresponding respectively to $W_N$, $W_W$. An SD circuit (106) performs a station detection based on $S_{RE}$ and $S_{BD-N}$, and determines the presence or absence of adjacent interference based on, e.g., $S_{BD-N}$ and $S_{BD-W}$.

4 Claims, 5 Drawing Sheets

FM TUNER HAVING ADAPTIVE BANDPASS FILTER FOR ADJACENT CHANNEL INTERFERENCE

CROSS-REFERENCE TO RELATED APPLICATION

The priority application number JP 2007-228415 upon which this patent application is based is hereby incorporated by reference.

BACKGROUND OF THE INVENTION

1. Field of the Invention

The present invention relates to an FM tuner for receiving frequency-modulated (FM) signals.

2. Description of the Related Art

With FM signals, the frequency of a carrier wave is changed on the basis of an audio signal or the like; therefore, a frequency bandwidth that is wider than for, e.g., AM signals, is required when they are transmitted. Accordingly, when an FM tuner receives a desired transmission signal, the tuner is readily subjected to interference from other signals transmitted at frequencies that are close to the frequency of the desired transmission signal (adjacent interference). Adjacent interference is capable of adversely affecting the quality of the audio signals detected from the reception signals. Specifically, adjacent interference occurs in a case where another station exists on a frequency that is close to that of the station the listener desires. The quality of the audio output reproduced by the FM tuner will also deteriorate in a multipath reception state, in which waves directly received from a radio broadcasting station are received along with waves reflected by buildings or other objects along the transmission path (multipath interference state). Adjacent interference and multipath interference are undesirable in radio data systems (RDS) wherein text data or the like is superimposed on an FM radio broadcast signal and transmitted.

FIG. 4 is a block diagram showing a configuration of a conventional FM tuner. An RF (radio frequency) signal received by an antenna 2 is frequency-converted to a first intermediate signal $S_{IF1}$ having a first intermediate frequency (IF) $f_{IF1}$, the $S_{IF1}$ is frequency-converted to a second intermediate signal $S_{IF2}$ having a second intermediate frequency $f_{IF2}$, and the $S_{IF2}$ is input to an IFBPF 4. The IFBPF 4 is a bandpass filter having a frequency $f_{IF2}$ as a center frequency. A bandwidth $W_F$ of the filter can vary within a range of, e.g., about 40 kHz to about 220 kHz.

An FM signal that has passed through the IFBPF 4 is inputted to an FM detection circuit 8 via a limiter amp 6. The FM detection circuit 8 FM-detects an output signal of the limiter amp 6, and outputs a detection signal $S_{DET}$.

An S-meter circuit 10 receives the first intermediate signal $S_{IF1}$, generates a signal $S_{M-AC}$ that corresponds to an amplitude variation component included in the inputted signal, and then smoothes the variation component using a low-pass filter (LPF) and generates a reception field strength signal $S_{M-DC}$. Included in the variation component signal $S_{M-AC}$ is a component that corresponds to adjacent interference and multipath interference.

A high-pass filter (HPF) 12, a detection circuit 14, and a comparator 16 are provided as circuits for detecting the presence or absence of adjacent interference and multipath interference on the basis of $S_{M-AC}$. The HPF 12 is capable of switching the cut-off frequency $f_c$ according to whether one or the other of a frequency band component corresponding to adjacent interference or a frequency band component corresponding to multipath interference is extracted from $S_{M-AC}$. Using a CR circuit, the detection circuit 14 detects the high-frequency component having passed through the HPF 12, and performs a conversion to DC voltage $V_{SQ}$. The comparator 16 compares an output level $V_{SQ}$ of the detection circuit 14 with a reference voltage $V_{ref1}$ set to a predetermined threshold value. For example, if $V_{SQ} > V_{ref1}$, a predetermined voltage $V_H$ (H level) corresponding to a logical value of "1" is output as an SQ sensor signal $S_{SQ}$ indicating a determination result that either adjacent interference or multipath interference has occurred. However, if $V_{SQ} \leq V_{ref1}$, a predetermined voltage $V_L$ (L level, $V_L < V_H$) corresponding to a logical value of "0" is output as $S_{SQ}$ indicating a determination result that neither adjacent interference nor multipath interference has occurred. In an FM tuner supporting RDS, an AF search is performed for automatically selecting a broadcasting station with favorable reception conditions. For example, $S_{SQ}$ is utilized in assessing the reception state when automatic channel selection is performed.

A circuit composed of an HPF 18 and a detection circuit 20 may be provided as another circuit for detecting adjacent interference. This circuit outputs a DC signal $S_{AI}$ of a voltage level that corresponds to the strength of a high-frequency component that can be generated by adjacent interference. For example, the cut-off frequency $f_c$ of the HPF 18 may be approximately 100 kHz.

The $V_{SQ}$ or $S_{AI}$ corresponding to an adjacent interference component is used in a bandwidth control circuit 22 for controlling a bandwidth $W_F$ of the IFBPF 4. The bandwidth control circuit 22 narrows $W_F$ in instances in which adjacent interference has occurred, and reduces the effect of adjacent interference on the output audio signal. The detection circuits 14, 20 perform the detecting using CR-assisted smoothing, and the detection outputs $V_{SQ}$, $S_{AI}$ accordingly provide a predetermined time constant. In a case where the $V_{SQ}$ or $S_{AI}$ is used to control of the bandwidth $W_F$ of the IFBPF 4, the time constants will have the effect of minimizing the effect on the output acoustic signal caused by $W_F$ being frequently switched between high and low.

A comparator 24, an SD band judgment circuit 26, and an SD circuit 28 are provided as circuits for detecting a broadcasting station when the aforedescribed AF search or another type of automatic station selection is performed. SD denotes "station detection". The comparator 24 compares the reception field strength signal $S_{M-DC}$ received from the S meter circuit 10, and a reference voltage $V_{ref2}$ set to a predetermined threshold value; and emits an H level output to the SD circuit 28 if $S_{M-DC} \geq V_{ref2}$, or an L level output if $S_{M-DC} < V_{ref2}$.

The FM detection circuit 8 detects the output signal of the limiter amplifier 6, and generates $S_{DET}$. $S_{DET}$ is fed to a stereo demodulating circuit (not shown). The stereo demodulating circuit demodulates the detection signal to an audio signal composed of an R channel signal and an L channel signal. The audio signal is fed to output terminals of a speaker or the like.

A f-V conversion ("S curve") characteristic exists between a frequency f of the intermediate signal $S_{IF2}$ received by the FM detection circuit 8 and a detection output voltage V. The SD band judgment circuit 26 uses the f-V conversion characteristic, and, based on a null voltage ΔV generated from the detection signal $S_{DET}$ produced by the FM detection circuit 8, determines whether the band of the reception station lies within the target band (SD band).

The null voltage ΔV is a signal that corresponds to the difference between an AFC voltage $V_{AFC}$ and a reference voltage $V_{ref3}$, with $V_{AFC}$ being generated once the detection output $S_{DET}$ of the FM detection circuit 8 has been smoothed by a capacitor $C_{AFC}$ that is earthed on one terminal. A resistor $R_{AFC}$ that acts as a load on the $V_{AFC}$ connects the $V_{AFC}$ and the reference voltage $V_{ref3}$, and the voltage generated between the terminals of the $R_{AFC}$ enters the SD band judgment circuit 26 as $\Delta V$. $V_{ref3}$ can be set so that the V at the intermediate frequency $f_{IF2}$ will be such that $\Delta V=0$. FIG. 5 is a graph that schematically depicts the f-V conversion characteristic, with the horizontal axis showing the frequency f, and the vertical axis showing the null voltage $\Delta V$.

The SD band has the intermediate frequency at its center, and is set to a predetermined width to avoid being adversely affected by signals from adjacent channels. The SD band judgment circuit 26 is configured using a window comparator, and is set so that the window is a voltage range associated with the SD band in accordance with the f-V conversion characteristic. In a case where the null voltage $\Delta V$ lies within the window, the SD band judgment circuit 26 outputs an H-level SD band judgment signal to the SD circuit 28.

The SD circuit 28 outputs the logical product (AND) of the outputs of the comparator 24 and the SD band judgment circuit 26 as an SD signal $S_{SD}$. The SD signal indicates whether the reception station has been detected at the tuning frequency set during automatic station selection. In a case where a reception signal of a predetermined strength is obtained in the SD band, the SD circuit 28 outputs an H level that shows that the reception station has been detected.

With RDS reception, an AF search is performed and a broadcasting station having a favorable reception state is automatically selected in order to receive an FM broadcast when the signal quality is consistently good, or in cases where reception is poor. In order to minimize periods of disrupted reception, the AF search is preferably performed at as high a speed as possible. However, quickly detecting the reception state is not the only important criterion when an AF search is performed; the accuracy with which the detection is performed must also be taken into consideration.

European RDS receivers in particular use only one channel in order to keep costs low. In order to perform an AF search using one channel, means is required for moving the reception channel to another broadcast channel for a limited period of time; and then accurately detecting adjacent interference while performing PLL locking, detecting stations, detecting adjacent interference, detecting multipath interference, and performing other processes.

However, problems have been presented in that adjacent interference is difficult to detect at a reliable degree of accuracy when the SQ sensor signal $S_{SQ}$ or the signal $S_{AI}$ generated from $S_{DET}$ is used in order to determine the presence of adjacent interference in the AF search. This is because the FM-modulated signals are superimposed on the AC component extracted from $S_{M-AC}$ and $S_{DET}$ by the HPF; and $S_{SQ}$ and $S_{AI}$, which are produced therefrom, change according to the degree of FM modulation. A further problem is presented in that the AC component cannot be obtained from $S_{M-AC}$ or $S_{DET}$ in a case where the adjacent interference signal is greater than the desired wave signal, and the reception channel is completely captured by the adjacent interference signal.

The low reliability with which adjacent interference is accurately detected as described above makes it difficult not only to suitably control the pass bandwidth of the IFBPF 4 used to reduce adjacent interference, but to determine in an accurate manner whether or not adjacent interference is present in the channel currently being received. As a result, complications are presented in precisely ascertaining the incoming signal condition of the channel currently being received, which is an important consideration when AF searching is performed.

SUMMARY OF THE INVENTION

The present invention was contrived in order to overcome the problems described above, and it is an object thereof to provide an FM tuner that enables adjacent interference to be detected with improved accuracy.

The FM tuner of the present invention comprises: an intermediate signal generating circuit for subjecting a reception signal to a frequency conversion wherein a carrier frequency of a desired reception FM signal is shifted to a predetermined intermediate frequency, and generating an intermediate signal; a detection circuit for detecting the intermediate signal, and generating a detection signal having a voltage value corresponding to an amount of frequency deviation; a band judgment circuit for generating a band judgment signal in relation to whether or not the detection signal is within a target voltage range that is set according to the band of the desired reception FM signal; a strength signal generating circuit for generating a field strength signal corresponding to a field strength of the reception signal; a strength judgment circuit for generating a strength judgment signal in relation to whether or not the field strength signal is equal to or higher than a predetermined reference strength; and a station detecting circuit for determining the presence or absence of the desired reception FM signal based on the strength judgment signal and the band judgment signal, and outputting a station detecting signal; wherein the station detecting circuit further determines the presence or absence of interference from an adjacent signal on the desired reception FM signal based on the strength judgment signal and the band judgment signal.

DESCRIPTION OF THE PREFERRED EMBODIMENTS

Figure 1:
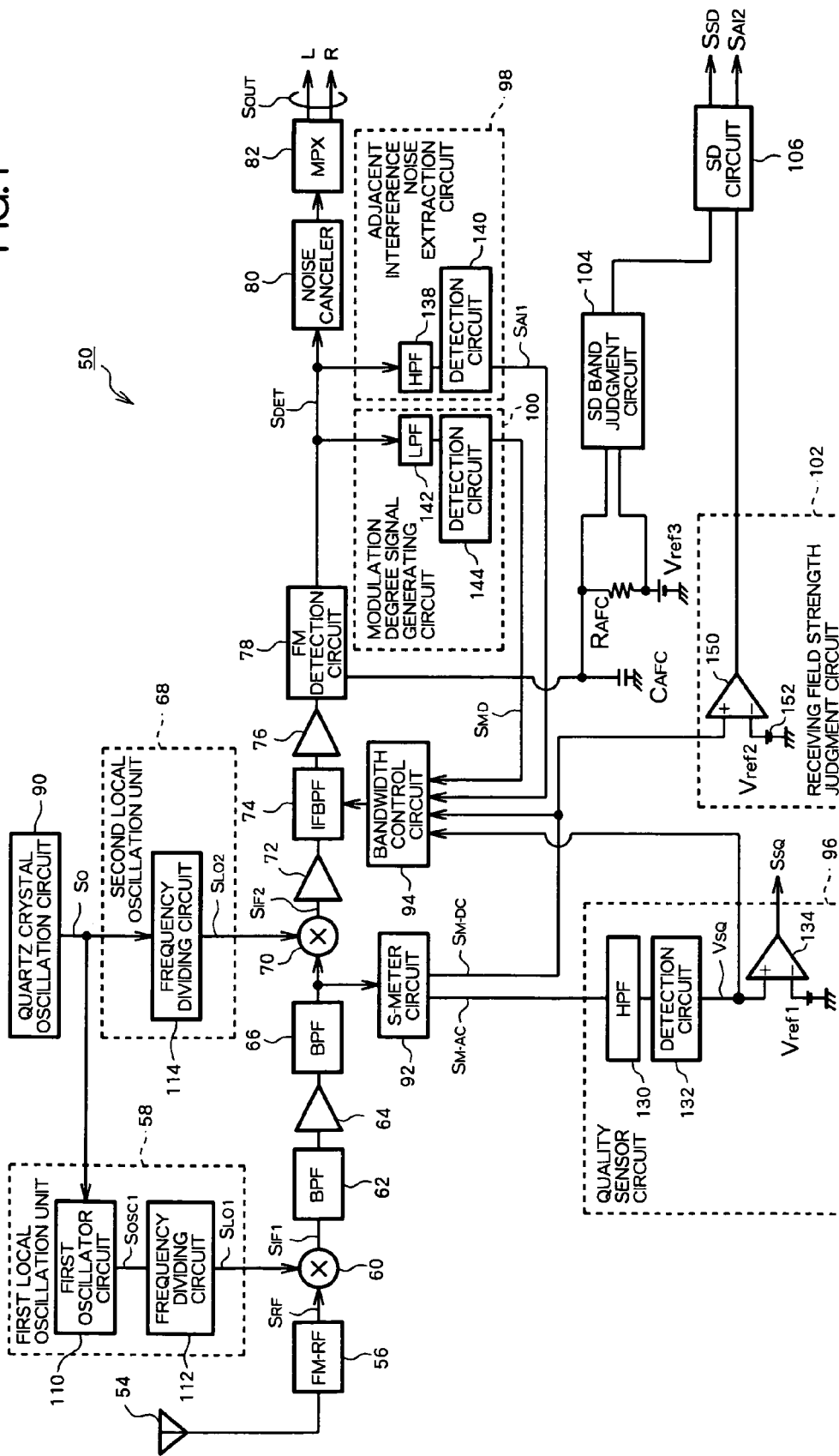
FIG. 1 is a schematic block diagram of an FM tuner according to an embodiment of the present invention.

The following section describes a preferred embodiment of the present invention (referred to hereafter as "embodiment") on the basis of the accompanying drawings. FIG. 1 is a schematic block diagram of an FM tuner according to the present embodiment. An FM tuner 50 is formed on a common circuit board with the main components thereof designed as integrated circuits, and is substantially configured as an integrated tuner module.

The module is incorporated as one component of an onboard audio device in an automotive vehicle, for example. An RF signal $S_{RF}$ received by an antenna 54 is inputted into a signal processing system in the FM tuner 50. The system comprises an FM-RF tuned amplifier circuit 56; a first local oscillation unit 58; a first mixing circuit 60; bandpass filters (BPF) 62, 66; buffer amps 64, 72; a second local oscillation unit 68; a second mixing circuit 70; an IFBPF 74; a limiter amplifier 76; an FM detection circuit 78; a noise canceler 80; and a matrix circuit (MPX circuit) 82. The signal processing system generates an output signal $S_{OUT}$ corresponding to the audio signal of the desired station from the RF signal $S_{RF}$.

In addition to the structural elements described above, the FM tuner 50 includes a quartz crystal oscillation circuit 90, an S-meter circuit 92, a bandwidth control circuit 94, a quality sensor circuit 96, an adjacent interference noise extraction circuit 98, a modulation degree signal generating circuit 100, a receiving field strength-judgment circuit 102, an SD band judgment circuit 104, and an SD circuit 106. The FM tuner 50 is connected to a system bus (not shown), and operates under the control of a microcomputer or other control unit (not shown) via the system bus.

The RF signal $S_{RF}$ is inputted to the FM-RF tuned amplifier circuit 56. The FM-RF tuned amplifier circuit 56 attenuates the components among the RF signal $S_{RF}$ that fall outside a band corresponding to a carrier wave frequency $f_R$ for the desired reception FM signal. The RF signal $S_{RF}$ in the band that includes the frequency $f_R$ for a station that a listener wishes to receive is, thereby, passed through the FM-RF tuned amplifier circuit 56. The signal outputted from the FM-RF tuned amplifier circuit 56 is inputted to the first mixing circuit 60.

The first local oscillation unit 58 has a first oscillator circuit 110 and a frequency dividing circuit 112. The first oscillator circuit 110 has a PLL circuit that uses an original oscillation signal $S_O$ output by the quartz crystal oscillation circuit 90 as a reference oscillation signal. The PLL circuit outputs an oscillation signal $S_{OSC1}$ having a frequency $f_{OSC1}$ corresponding to the station that the listener wishes to receive. The $f_{OSC1}$ is controlled by a controller in the first oscillator circuit 110. The $f_{OSC1}$ is set to $\alpha \cdot (f_R + f_{IF1})$ or $\alpha \cdot (f_R - f_{IF1})$, where $\alpha$ is the division ratio of the frequency division circuit 112. The division circuit 112 divides $S_{OSC1}$ from the first oscillation circuit 110 by $\alpha$, generates $S_{LO1}$, and sends an output to the first mixing circuit 60.

The first mixing circuit 60 mixes the inputted RF signal $S_{RF}$ with the first local oscillation signal $S_{LO1}$ inputted from the first local oscillation unit 58, and generates a first intermediate signal $S_{IF1}$. A frequency $f_{LO1}$ of $S_{LO1}$ is adjusted to be converted to a predetermined first intermediate frequency $f_{IF1}$ in a frequency conversion of the signal for the desired station having a frequency $f_R$ and included in $S_{RF}$ to the $S_{IF1}$ outputted by the first mixing circuit 60. The first intermediate frequency $f_{IF1}$ is set, for example, to 10.7 MHz.

$S_{IF1}$ is inputted to the second mixing circuit 70 via the BPF 62, the buffer amp 64, and the BPF 66. The BPFs 62, 66 may be configured using, e.g., a ceramic filter.

In response to a case where $f_{IF1}$ is set to 10.7 MHz and $f_{IF2}$ is set to 450 kHz, the second local oscillation unit 68 generates an $S_{LO2}$ with a frequency $f_{LO2}$ of 10.25 MHz. The second local oscillation unit 68 of the present embodiment has a frequency division circuit 114 in order to generate $S_{LO2}$. The frequency division circuit 114 divides by 2 the oscillation signal $S_O$ that is outputted by the quartz crystal oscillation circuit 90 and has a frequency of, e.g., 20.5 MHz; generates $S_{LO2}$, and feeds the signal to the second mixing circuit 70.

The second mixing circuit 70 mixes the first intermediate signal $S_{IF1}$ input from the BPF 66 with the second local oscillation signal $S_{LO2}$ input from the second local oscillation unit 68, and generates a second intermediate signal $S_{IF2}$ having a second intermediate frequency $f_{IF2}$. The frequency $f_{LO2}$ of $S_{LO2}$ is set to $(f_{IF1} - f_{IF2})$, and the desired reception signal having frequency $f_{IF1}$ and included in $S_{IF1}$ is converted to frequency $f_{IF2}$ in the second mixing circuit 70. The second intermediate frequency $f_{IF2}$ is set, for example, to 450 kHz.

$S_{IF2}$ is inputted to the IFBPF 74 via the buffer amp 72. The IFBPF 74 is a bandpass filter that uses $f_{IF2}$ as the center frequency and is capable of variably setting the pass bandwidth $W_F$. The pass bandwidth $W_F$ of the IFBPF 74 is controlled by the bandwidth control circuit 94, as will be discussed hereafter.

$S_{IF2}$ outputted from the IFBPF 74 is fed into the limiter amplifier 76. The limiter amplifier 76 increases the amplitude of the FM signal and creates a rectangular wave. As a result, the AM modulation component superimposed on the FM signal due to multipath interference or another reason can be eliminated, and any deterioration in the demodulation S/N originating from AM modulation will be prevented. The FM signal that has been amplified by the limiter amplifier 76 and turned into a rectangular wave is inputted to the FM detection circuit 78. The FM detection circuit 78 is composed of, e.g., a quadrature detection circuit. The FM detection circuit 78 performs FM detection of $S_{IF2}$ that has been inputted from the limiter amplifier 76, and outputs a detection output signal $S_{DET}$. Over the past several years, the main format used for an FM detection circuit 78 has been one in which quadrature detection or PLL detection is used, and not an LC tuned circuit. One characteristic of such formats is the wide bandwidth of the f-V conversion characteristic. For example, the f-V conversion characteristic may be used within a range of approximately ±200 kHz for the central frequency $f_{IF2}$ of the intermediate signal $S_{IF2}$ that is inputted to the FM detection circuit 78.

The noise canceler 80 removes pulse noise from the detection output signal $S_{DET}$. For instance, in a FM tuner installed in an automotive vehicle, the reception signal can be superimposed with noise in the form of pulses, having a short time width and a high amplitude, as caused by the operation of the vehicle engine, power-assisted mirrors, windshield wipers, or other components. The noise canceler 80 minimizes any deterioration in sound quality caused by pulse noise. Once the pulse noise has been removed, $S_{DET}$ is inputted into the matrix circuit 82.

During a stereo broadcast, the matrix circuit 82 uses a pilot signal inputted from a pilot signal extraction circuit (not shown) to cancel out a pilot signal from $S_{DET}$, and is able extract the (L+R) signal and the (L−R) signal, respectively. The matrix circuit 82 can separate the L signal and the R signal from the (L+R) signal and the (L−R) signal and output them.

The S-meter circuit 92 generates a signal $S_{M-AC}$ corresponding to the variation component included in $S_{IF1}$ on the basis of, e.g., $S_{IF1}$ inputted from the BPF 66; smoothes the variation component using the LPF; and generates the reception field strength signal $S_{M-DC}$.

$S_{M-DC}$ is inputted to the receiving field strength judgment circuit 102 and the bandwidth control circuit 94. These components shall be described hereunder.

$S_{M-AC}$ is inputted to the quality sensor circuit 96. The quality sensor circuit 96 is a circuit that detects the presence of adjacent interference or multipath interference based on $S_{M-AC}$, and comprises an HPF 130, a detection circuit 132, and a comparator 134.

The HPF 130 is capable of switching the cut-off frequency $f_c$ according to whether one or the other of a frequency band component corresponding to adjacent interference or a frequency band component corresponding to multipath interference is extracted from $S_{M-AC}$. With regard to adjacent interference, if $\Delta f$ is used as the RF frequency differential between the broadcast station causing adjacent interference and the desired station, a high-frequency component having a frequency corresponding to $\Delta f$ will appear in $S_{M-AC}$ when adjacent interference occurs. For example, since the FM channels in Japan are broadcast in steps of 100 kHz, the cut-off frequency $f_c$ of the HPF 130 when the component corresponding to the adjacent interference is extracted from $S_{M-AC}$ can be, e.g., approximately 100 kHz. Furthermore, since the frequency of high-frequency components caused by multipath interference are typically not as high as the component caused by adjacent interference, the $f_c$ when the component corresponding to multipath interference are extracted from $S_{M-AC}$ can be set to approximately 50 kHz.

The detection circuit 132 rectifies and detects the high-frequency components passing through the HPF 130, and generates a DC signal $V_{SQ}$ of a voltage level that corresponds to the amount of adjacent interference noise components or multipath noise. The $V_{SQ}$ is used to switch the passing bandwidth $W_F$ of the IFBPF 74 between high and low in the bandwidth control circuit 94, as described hereunder. In order to diminish the effect on the output audio signal caused by frequent switching of the $W_F$, the $V_{SQ}$ is smoothed using a predetermined time constant.

The comparator 134 compares an output level $V_{SQ}$ of the detection circuit 132 with a reference voltage $V_{ref1}$ set to a predetermined threshold value. For example, if $V_{SQ} > V_{ref1}$, the comparator 134 outputs an H level as an SQ sensor signal $S_{SQ}$ indicating a determination result that adjacent interference or multipath interference has occurred. However, if $V_{SQ} \leq V_{ref1}$, the comparator 134 outputs an L level as $S_{SQ}$ indicating a determination result that neither adjacent interference nor multipath interference have occurred.

The adjacent interference noise extraction circuit 98 is provided as a separate circuit for detecting adjacent interference. The adjacent interference noise extraction circuit 98 extracts adjacent interference noise components included in the output signal $S_{DET}$ of the FM detection circuit 78. The signal $S_{DET}$ that is generated when adjacent interference occurs has not only a signal component of an audio band corresponding to the desired station but also a high-frequency component having a frequency corresponding to the RF frequency differential $\Delta f$ between the desired station and the interfering station. The adjacent interference noise extraction circuit 98 has a HPF 138 and a detection circuit 140; and outputs a DC signal $S_{AI1}$ of a voltage level that corresponds to the strength of the high-frequency components that can be generated by adjacent interference. For example, the cut-off frequency $f_c$ for the HPF 138 can be set to about 100 kHz, as with the HPF 130. $S_{AI1}$ is inputted to the bandwidth control circuit 94.

The modulation degree signal generation circuit 100 generates a DC signal $S_{MD}$ of a voltage level corresponding to the degree of modulation of the reception signal on the basis of $S_{DET}$. The modulation degree signal generation circuit 100 is composed of an LPF 142 and a detection circuit 144. The circuit removes the high-frequency component caused by adjacent interference or the like, and outputs the DC signal $S_{MD}$ of a voltage level corresponding to the degree of modulation. $S_{MD}$ is used by the bandwidth control circuit 94.

The bandwidth control circuit 94 controls the bandwidth $W_F$ of the IFBPF 74 on the basis of $S_{M-DC}$ generated by the S-meter circuit 92, the $V_{SQ}$ generated in the quality sensor circuit 96, $S_{AI1}$ generated by the adjacent interference noise extraction circuit 98, and $S_{MD}$ outputted from the modulation degree signal generation circuit 100. For example, the bandwidth control circuit 94 determines whether or not the adjacent interference strength has exceeded a predetermined threshold value on the basis of $V_{SQ}$ and $S_{AI1}$; and, if the strength is equal to or less than the threshold value, the bandwidth control circuit 94 sets the $W_F$ to a standard bandwidth that is relatively wide so audio distortion will not occur. However, in an instance in which either or both of $V_{SQ}$ and $S_{AI1}$ exceed the threshold value, the bandwidth control circuit 94 determines that adjacent interference has occurred, and makes the $W_F$ narrower than the standard bandwidth. As a result, it is possible to remove the adjacent interference wave in the IFBPF 74.

In a case where, based of $S_{M-DC}$ and $S_{MD}$, the receiving field strength is in a weak state at or below a predetermined level, and a state of a low predetermined degree of modulation has been detected, the bandwidth control circuit 94 will make the bandwidth $W_F$ narrower even if, e.g., the adjacent interference strength is at or below a predetermined threshold value. As a result, treble component noise that increases in a weak field state is removed by the IFBPF 74, and sensitivity is improved. In the case of a high degree of modulation, audio distortion will readily occur if $W_F$ is narrowed. Therefore, in the case of a high degree of modulation, the bandwidth control circuit 94 sets the $W_F$ to the standard bandwidth, even in a weak field state, provided that adjacent interference does not occur. However, in a state in which adjacent interference does occur, the eliminating of adjacent interference is prioritized over the preventing of audio distortion, and $W_F$ is narrowed, even at a high degree of modulation.

The FM tuner 50 supports RDS, and has a circuit for detecting a broadcasting station during automatic station selection. The circuit comprises the receiving field strength judgment circuit 102, the SD band judgment circuit 104, and the SD circuit 106. The circuit is characterized not only by functioning to detect stations as has typically been performed in the past, but also by functioning as adjacent interference detecting means for enabling high-speed AF searching under RDS.

The receiving field strength judgment circuit 102 determines whether the received-signal electrical field strength at the tuning frequency that has been set during automatic station selection is of an adequate level. The receiving field strength judgment circuit 102 determines the result based on $S_{M-DC}$, which is output by the S-meter circuit 92. The receiving field strength judgment circuit 102 comprises, e.g., a comparator 150 and a voltage source 152 for feeding a reference voltage $V_{ref2}$. $V_{ref2}$ is set to a predetermined threshold value. The comparator 150 compares $S_{M-DC}$ with $V_{ref2}$ and outputs a receiving strength judgment signal $S_{RE}$. For example, if $S_{M-DC} \geq V_{ref2}$, the comparator 150 outputs an H level as a signal $S_{RE}$ indicating a determination result that the receiving field strength is of an adequate level. However, if $S_{M-DC} < V_{ref2}$, the comparator 150 outputs an L level as a signal $S_{RE}$ indicating a determination result that the receiving field strength is not of an adequate level. The receiving strength judgment signal $S_{RE}$ is input to the SD circuit 106.

The SD band judgment circuit 104 is a circuit for determining whether the band of a received station lies within a predetermined frequency range $W_{BD}$, based on the null voltage $\Delta V$ generated from the detection signal $S_{DET}$, which is itself generated by the FM detection circuit 78. The SD band judgment circuit 104 is configured using a window comparator.

Figure 2:
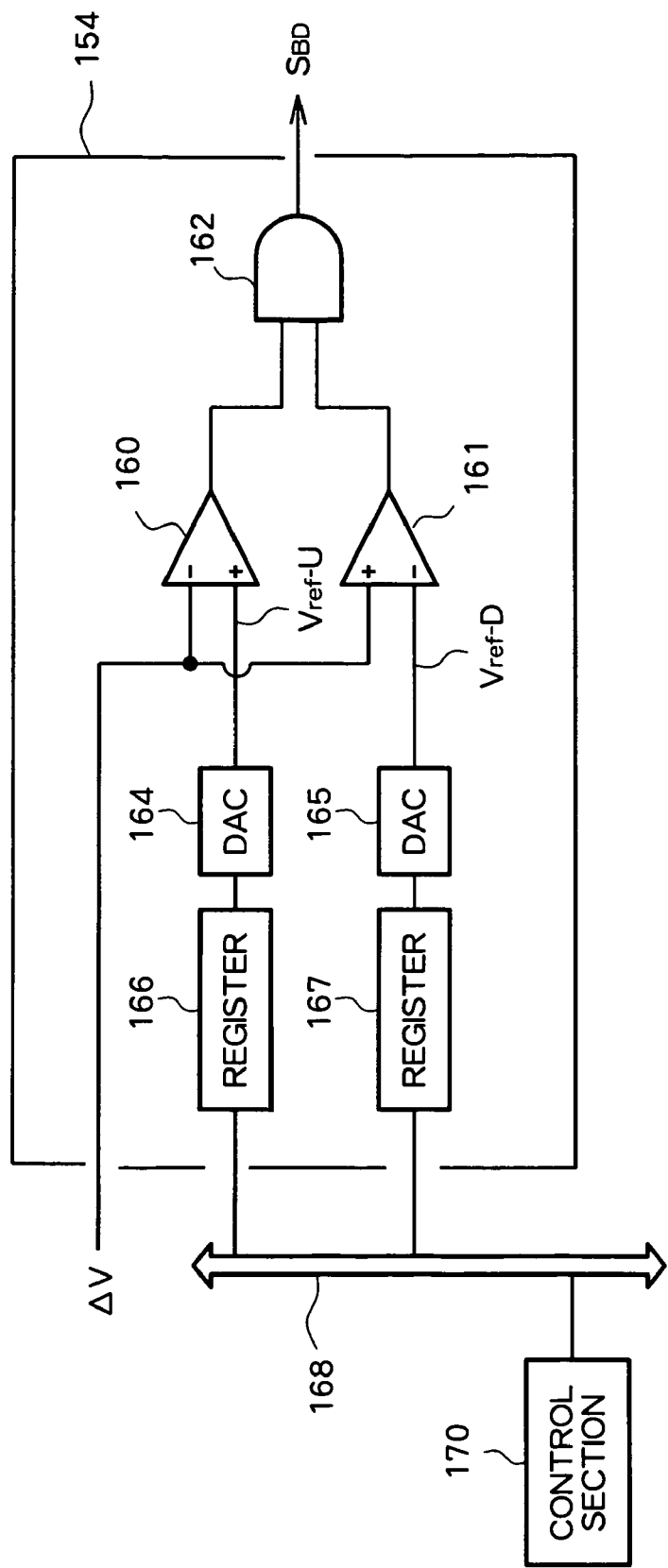
FIG. 2 is a schematic circuit structure diagram showing an example of a window comparator that constitutes an SD band judgment circuit.

FIG. 2 is a schematic circuit structure diagram showing an example of a window comparator 154 that constitutes the SD band judgment circuit 104. The window comparator 154 has, as a window, a voltage range [$V_{ref-D}, V_{ref-U}$] corresponding to the frequency range $W_{BD}$ on the f-V conversion characteristic. In a case where $\Delta V$ lies within the window, an SD band judgment signal $S_{BD}$ having an H level is output to the SD circuit 106, whereas if $\Delta V$ lies outside the window, $S_{BD}$ having an L level is output to the SD circuit 106. The window comparator 154 comprises a comparator 160, 161; an AND circuit 162; a digital-to-analog conversion circuit (DAC) 164, 165; and a register 166, 167.

ΔV is input to the (−) terminal of the comparator 160; and the reference voltage $V_{ref\text{-}U}$, which is the upper limit of the window, is input from the DAC 164 to the (+) terminal. ΔV is input to the (+) terminal of the comparator 161; and reference voltage $V_{ref\text{-}D}$, which is the lower limit of the window, is input from the DAC 165 to the (−) terminal. In a case where ΔV lies within the window, the outputs of the comparators 160, 161 will both be H level, and the AND circuit 162 will output an H level as $S_{BD}$. In a case where ΔV lies in a range that is below $V_{ref\text{-}D}$ or above $V_{ref\text{-}U}$, one of the outputs of the comparators 160, 161 will be L level; therefore, the AND circuit 162 will output an L level as $S_{BD}$.

The DACs 164, 165 generate a voltage corresponding to data set respectively in the registers 166, 167. The registers 166, 167 are connected to a control section 170 of a microcomputer or the like via a system bus 168. The control section 170 rewrites the reference voltage data stored in the registers 166, 167, thereby allowing the size of the frequency range $W_{BD}$ relating to the determining of the band to be changed.

The SD band judgment circuit 104 performs a determination based on two types of $W_{BD}$; one for when $W_{BD}$ is a narrow band $W_N$, and one for when $W_{BD}$ is a wide band $W_W$. In a corresponding manner, the SD band judgment circuit 104 comprises, e.g., two window comparators 154, enabling a configuration wherein one comparator performs a band determination for when $W_{BD}$ is a narrow band $W_N$, and the other comparator performs a band determination for when $W_{BD}$ is a wide band $W_W$. The narrow band $W_N$ is centered on the second intermediate frequency $f_{IF2}$ and is set so that, e.g., signals of adjacent channels will cause no adverse effect. The wide band $W_W$ is centered on the second intermediate frequency $f_{IF2}$ and is set to be greater than $W_N$; i.e., so that a part will include $W_N$. For example, the wide band $W_W$ is set to a width that will include adjacent channels. For example, the control section 170 can set $W_N$ to approximately $f_{IF2}\pm 50$ kHz and $W_W$ to approximately $f_{IF2}\pm 200$ kHz in compliance with FM broadcasts within Japan.

The SD band judgment circuit 104 comprises only one window comparator 154, and can have a simple construction wherein the control section 170 alternatingly switches $W_{BD}$ between the narrow band $W_N$ and the wide band $W_W$.

The SD circuit 106 generates an SD signal $S_{SD}$, which indicates whether or not the desired broadcasting station has been detected at the tuning frequency set during automatic station selection; and an adjacent interference judgment signal $S_{AI2}$, which expresses whether adjacent interference is present. The SD circuit 106 generates these signals based on a value $D_{RE}$ of $S_{RE}$, which is outputted from the receiving field strength judgment circuit 102; and values $D_{BD\text{-}N}$ of $S_{BD}$ corresponding to $W_N$ and $D_{BD\text{-}W}$ of $S_{BD}$ corresponding to $W_W$, with $S_{BD}$ being obtained from the SD band judgment circuit 104.

In a case where the receiving field strength is equal to or greater than a threshold value, and the band of the reception station is in the narrow band $W_N$, the SD circuit 106 determines that the desired reception station has been detected, and outputs an H level as $S_{SD}$. Specifically, according to the present embodiment, $S_{SD}$ can be generated by an AND circuit into which $S_{RE}$ and $S_{BD}$ corresponding to $W_N$ have been inputted.

Figure 3:
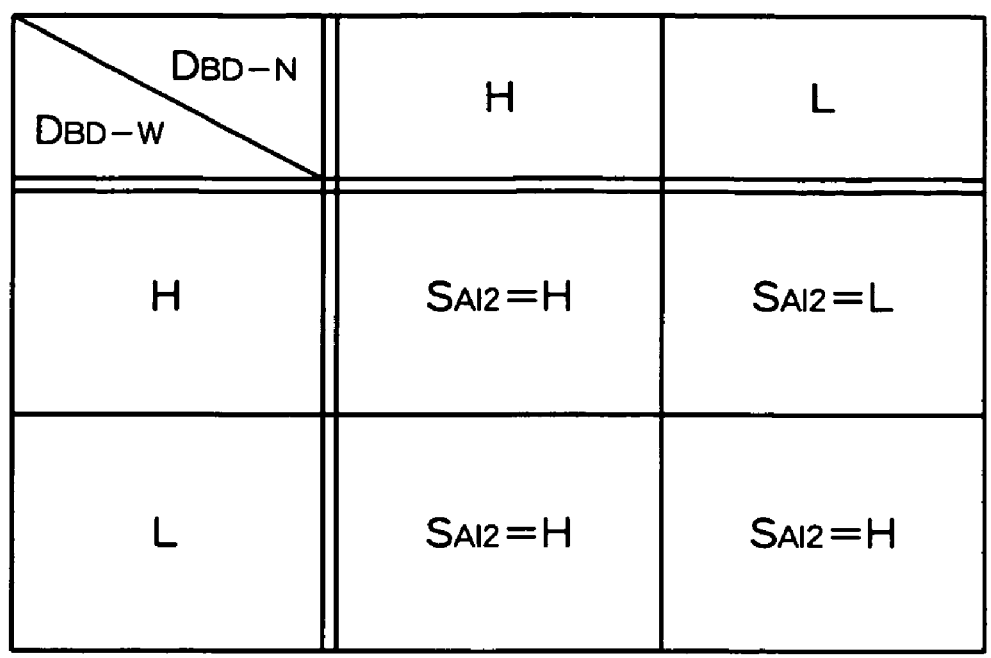
FIG. 3 is a descriptive diagram for showing an example of $S_{AI2}$, which is generated by an SD circuit.
Figure 4:
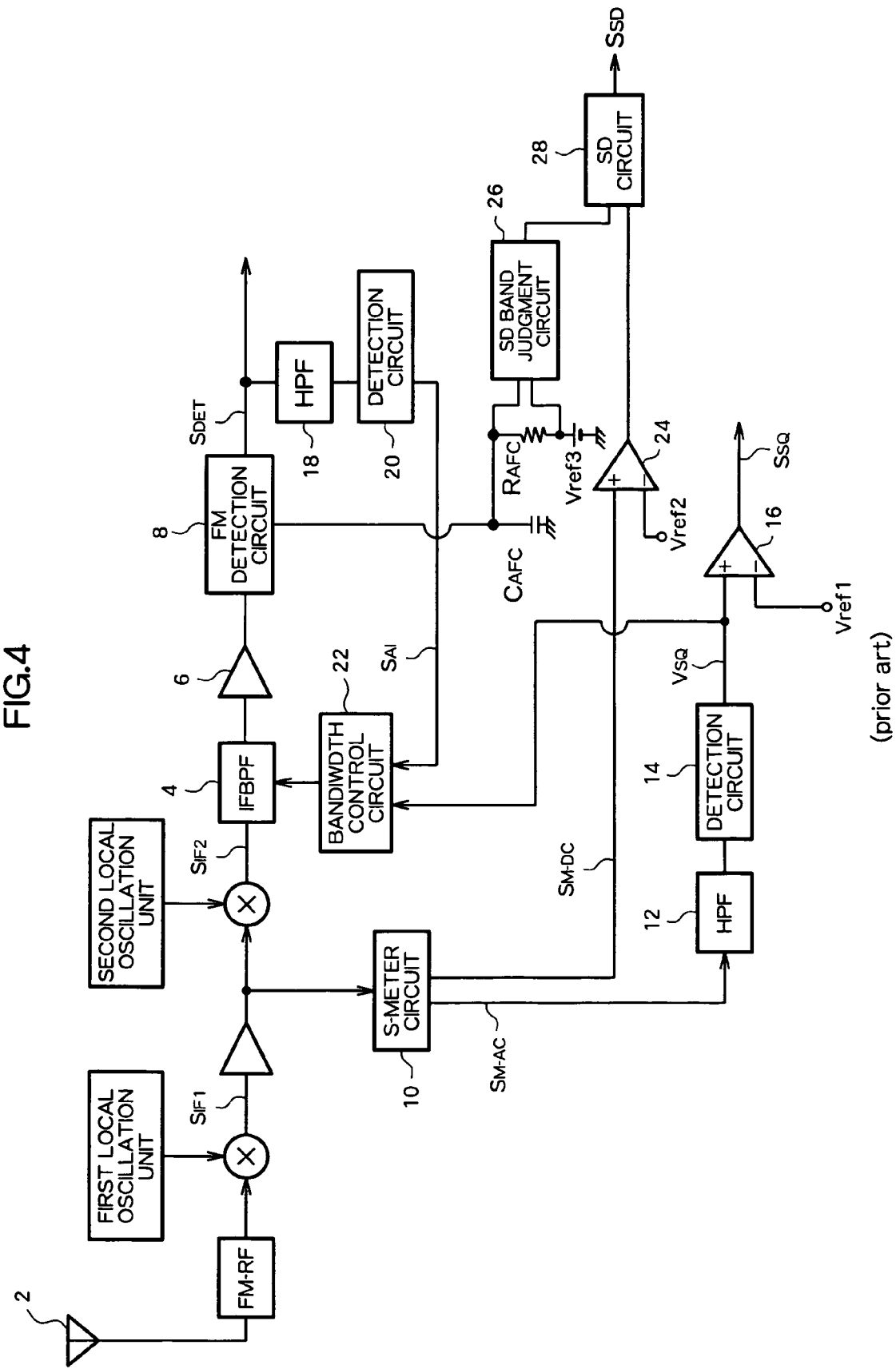
FIG. 4 is a block diagram for showing the configuration of a conventional FM tuner.
Figure 5:
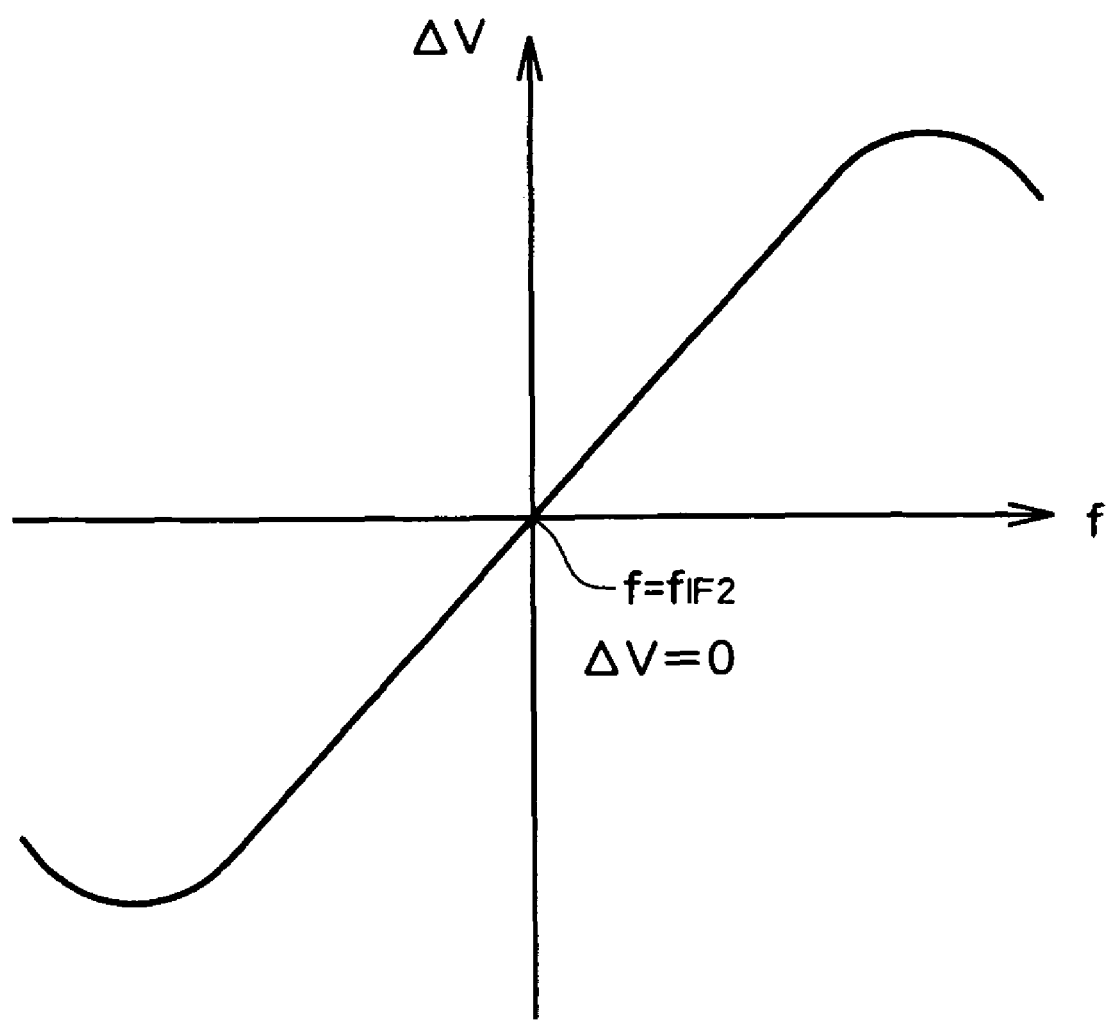
FIG. 5 is a schematic diagram showing an f-V conversion characteristic (S curve).

A description shall now be provided of $S_{AI2}$ being generated from the SD circuit 106. FIG. 3 is a descriptive diagram showing an example of $S_{AI2}$, which is generated by the SD circuit 106. The SD circuit 106 determines the value of $S_{AI2}$ based on $D_{BD\text{-}N}$ and $D_{BD\text{-}W}$, and FIG. 3 shows whether $S_{AI2}$ has been set to the H level state or the L level state.

In a case where $D_{BD\text{-}N}$=H, a reception signal of the desired broadcasting station is present. In such a case, even if interference from an adjacent station is present, then as long as $D_{BD\text{-}N}$=H, the desired broadcasting station will be stronger than the adjacent station, and a good reception state can be obtained. Accordingly, when $D_{BD\text{-}N}$=H, the SD circuit 106 will determine that no adverse effects are occurring as a result of interference from the adjacent station, and will output an H level as $S_{AI2}$. As long as $D_{BD\text{-}N}$=H, then automatically $D_{BD\text{-}W}$=H. As a rule, the combination of $D_{BD\text{-}N}$=H and $D_{BD\text{-}W}$=L will not occur. However, the appearance of such a combination cannot be completely ruled out for reasons relating, for example, to the stability of the circuit, the determination in the $W_N$ state and the determination in the $W_W$ state being performed in a time-divided manner rather than simultaneously, and the like. Since $D_{BD\text{-}W}$=L in such instances, it follows that a reception signal of an adjacent station will not be present; therefore, the SD circuit 106 can be configured so that, e.g., an H level expressing that no adverse effect is being caused by interference from an adjacent station will be output as $S_{AI2}$ for such a combination.

If $D_{BD\text{-}N}$=L and $D_{BD\text{-}W}$=H, it means that only the reception signal of an adjacent station is present, or the reception signal of the desired broadcasting station is subjected to a degree of interference from an adjacent station that is comparatively greater, and the band shifts outside of $W_N$. In such cases, the SD circuit 106 will determine that interference from an adjacent station is present, and will output an L level as $S_{AI2}$.

If $D_{BD\text{-}N}$=L and $D_{BD\text{-}W}$=L, it means either that no reception signal is present for the desired broadcasting station or an adjacent station, or the signal is extremely faint. Although neither of these states is regarded to be satisfactory, it is of primary import that the presence or absence of adjacent interference will be indicated; therefore, $S_{AI2}$ can be set to an H level.

The detecting of adjacent interference using the SD circuit 106, which is provided in order to generate the SD signal $S_{SD}$, tends not to be affected by variation in AC components and other such occurrences. Therefore, adjacent interference can be detected in a highly accurate manner.

It should be noted that the SD band judgment circuit 104, which has two window comparators 154, is able to obtain $D_{BD\text{-}N}$ and $D_{BD\text{-}W}$ in parallel; therefore, the presence or absence of adjacent interference can be rapidly determined. Furthermore, the control section 170 does not have to perform a process wherein a command for switching the bandwidth $W_{BD}$ is executed and the registers 166, 167 are rewritten on the SD band judgment circuit 104. Specifically, the switching process load is obviated, allowing time to be reduced and the control streamlined.

It is also possible to adopt a circuit structure that does not involve the SD being detected by the two window comparators 154. For example, a configuration may be used wherein the two window comparators 154 output $D_{BD\text{-}N}$ and $D_{BD\text{-}W}$ to an external microcomputer or other device, whereupon the microcomputer performs the decisions in regard to the aforedescribed combinations of $D_{BD\text{-}N}$ and $D_{BD\text{-}W}$, and detects the SD. Outputting of $D_{BD\text{-}N}$ and $D_{BD\text{-}W}$ to the microcomputer or other device as performed in such instances can be accomplished using a port that doubles as another sensor output or the like.

It is also possible to use the SD band judgment circuit 104 for performing a determination only for the narrow band $W_N$. In such a case, the SD circuit 106 generates a signal $S_{AI2}$ indicating whether or not adjacent interference is present based on $D_{BD\text{-}N}$, which is obtained using the SD band judgment signal $S_{BD}$ from the SD band judgment circuit 104, and $D_{RE}$, which is obtained using the receiving strength judgment signal $S_{RE}$ from the receiving field strength judgment circuit 102. If $D_{RE}$=H, then a reception signal from the desired broadcasting station or an adjacent station is present. In such a case, as long as $D_{BD-N}$=H, then interference from an adjacent station will be judged to be absent, as discussed using the description for FIG. 3. However, if $D_{BD-N}$=L, then, as discussed using the description for FIG. 3 for a case where $D_{BD-N}$=L and $D_{BD-W}$=H, a decision will be made that interference from an adjacent station is present. Specifically, the SD circuit 106 sets $S_{AI2}$ to H level in the case where $D_{RE}$=H and $D_{BD-N}$=H, and sets $S_{AI2}$ to L level in the case where $D_{RE}$=H and $D_{BD-N}$=L. In the case where $D_{RE}$=L, it means that no reception signal is present for the desired broadcasting station or for an adjacent station, or that the signal is extremely faint. For example, $S_{AI2}$ can be set to H level, as with the case in FIG. 3 when $D_{BD-N}$=L and $D_{BD-W}$=L.

According to the embodiment described above, there has been described a configuration wherein the method of the present invention for detecting adjacent interference is employed for AF searching under RDS, with the method using, inter alia, a SD circuit 106 provided to generate an SD signal $S_{SD}$. However, the method of the present invention for detecting adjacent interference may also be used to detect adjacent interference in reception performed in non-RDS-supporting FM tuners or reception in normal circumstances. For example, a configuration may be adopted wherein adjacent interference is detected by the present invention during reception, and an AF search is initiated in a case where adjacent interference is determined to be present. It is also possible to use $S_{AI2}$ to control the bandwidth $W_F$ of the IFBPF 74 instead of $V_{SQ}$, which is generated in the quality sensor circuit 96, or $S_{AI1}$, which is generated by the adjacent interference noise extraction circuit 98.

According to the present invention, the presence or absence of a reception signal in a frequency range corresponding to a band of a desired reception FM signal is determined based on an FM detection output using an f-V conversion characteristic. The presence or absence of adjacent interference is determined on the basis of the associated results. A null voltage ΔV used for the determination is not readily affected by AC component variation or other factors, allowing adjacent interference to be accurately detected.

What is claimed is:

1. An FM tuner comprising:
an intermediate signal generating circuit for subjecting a reception signal to a frequency conversion wherein a carrier frequency of a desired reception FM signal is shifted to a predetermined intermediate frequency, and generating an intermediate signal;
a detection circuit for detecting the intermediate signal, and generating a detection signal having a voltage value corresponding to an amount of frequency deviation;
a band judgment circuit for generating a band judgment signal in relation to whether or not the detection signal is within a target voltage range that is set according to the band of the desired reception FM signal, wherein:
the band judgment circuit includes a first comparator for determining if the detection signal is below an upper limit value of the target voltage range;
a second comparator for determining if the detection signal is above a lower limit value of the target voltage range;
a first digital-to-analog conversion circuit to supply the upper limit value based on the desired reception FM signal;
a second digital-to-analog conversion circuit to supply the lower limit value based on the desired reception FM signal; and
an AND circuit outputting the band judgment signal based on the signals received from the first comparator and the second comparator;
a strength signal generating circuit for generating a field strength signal corresponding to a field strength of the reception signal;
a strength judgment circuit for generating a strength judgment signal in relation to whether or not the field strength signal is equal to or higher than a predetermined reference strength; and
a station detecting circuit for determining the presence or absence of the desired reception FM signal based on the strength judgment signal and the band judgment signal, and outputting a station detecting signal; wherein
the station detecting circuit further determines that a state in which the field strength signal is equal to or higher than the reference strength and the detection signal is within the target voltage range and a state in which the field strength signal is lower than the reference strength indicates the absence of interference from the adjacent signal, and determines that a state in which the field strength signal is equal to or higher than the reference strength and the detection signal is not within the target voltage range indicates the presence of interference from the adjacent signal.

2. An FM tuner comprising:
an intermediate signal generating circuit for subjecting a reception signal to a frequency conversion wherein a carrier frequency of a desired reception FM signal is shifted to a predetermined intermediate frequency, and generating an intermediate signal;
a detection circuit for detecting the intermediate signal, and generating a detection signal having a voltage value corresponding to an amount of frequency deviation;
a band judgment circuit for generating a first band judgment signal that expresses whether or not the detection signal is within a target voltage range that is set according to the band of the desired reception FM signal, and a second band judgment signal that expresses whether or not the detection signal is within an expanded voltage range that includes the target voltage range, wherein the first band judgment signal and the second band judgment signal are generated at the same time; and
an adjacent interference detecting circuit for determining the presence or absence of interference from an adjacent signal on the desired reception FM signal based on the first band judgment signal and second band judgment signal.

3. The FM tuner of claim 2, wherein
the adjacent interference detecting circuit determines that a state in which the detection signal is only within the expanded voltage range, among the target voltage range and the expanded voltage range, indicates the presence of interference from the adjacent signal; and determines that a state in which the detection signal is within the target voltage range indicates the absence of interference from the adjacent signal.

4. The FM tuner of claim 2, wherein
the band judgment circuit has
a first window comparator for outputting the first band judgment signal based on a result of a comparison between a pair of reference voltages according to the target voltage range and the detection signal; and
a second window comparator for outputting the second band judgment signal based on a result of a comparison between a pair of reference voltages according to the expanded voltage range and the detection signal.

\* \* \* \* \*